United States Patent
Cao et al.

(10) Patent No.: US 9,502,575 B2
(45) Date of Patent: Nov. 22, 2016

(54) OXIDE THIN FILM TRANSISTOR ARRAY SUBSTRATE HAVING TRANSPARENT CONNECTION STRUCTURE CONNECTING SOURCE ELECTRODE AND DATA LINE OF OXIDE TFT AND DISPLAY PANEL INCLUDING THE SAME

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Binbin Cao, Beijing (CN); Chengshao Yang, Beijing (CN); Bozhu Zhou, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 57 days.

(21) Appl. No.: 14/354,215

(22) PCT Filed: Apr. 24, 2013

(86) PCT No.: PCT/CN2013/074651
§ 371 (c)(1),
(2) Date: Apr. 25, 2014

(87) PCT Pub. No.: WO2014/117443
PCT Pub. Date: Aug. 7, 2014

(65) Prior Publication Data
US 2015/0295091 A1    Oct. 15, 2015

(30) Foreign Application Priority Data
Feb. 4, 2013    (CN) .......................... 2013 1 0044103

(51) Int. Cl.
*H01L 29/786*    (2006.01)
*H01L 27/32*    (2006.01)
(Continued)

(52) U.S. Cl.
CPC ......... *H01L 29/7869* (2013.01); *G02F 1/1368* (2013.01); *G02F 1/136286* (2013.01);
(Continued)

(58) Field of Classification Search
None
See application file for complete search history.

(56) References Cited

U.S. PATENT DOCUMENTS 5,821,564 A    10/1998    Wu et al.
2001/0003658 A1    6/2001    Kim
(Continued)

FOREIGN PATENT DOCUMENTS

CN    102122672 A    7/2011
JP    6261364 A    3/1987
(Continued)

OTHER PUBLICATIONS

Written Opinion of the International Searching Authority dated Nov. 4, 2013; PCT/CN2013/074651.
(Continued)

*Primary Examiner* — Michael Jung
(74) *Attorney, Agent, or Firm* — Ladas & Parry LLP

(57) ABSTRACT

An oxide thin film transistor array substrate, a manufacturing method thereof and a display panel are provided. The oxide TFT array substrate includes a base substrate and an oxide TFT, a gate line, a data line and a pixel electrode provided on the base substrate, the drain electrode of the oxide TFT being connected with the pixel electrode, wherein a connection structure is provided between the source electrode of the oxide TFT and the data line, by which the source electrode of the oxide TFT and the data line are electrically connected, and the resistivity of the connection structure is larger than the resistivity of the source electrode.

10 Claims, 3 Drawing Sheets

(51) Int. Cl.

| | | |
|---|---|---|
| *G02F 1/1368* | (2006.01) | |
| *G02F 1/1362* | (2006.01) | |
| *H01L 27/12* | (2006.01) | |
| *H01L 21/02* | (2006.01) | |
| *H01L 29/24* | (2006.01) | |
| *H01L 29/423* | (2006.01) | |
| *H01L 29/66* | (2006.01) | |

(52) U.S. Cl.
 CPC ....... *H01L21/02565* (2013.01); *H01L 27/124* (2013.01); *H01L 27/1225* (2013.01); *H01L 27/1248* (2013.01); *H01L 27/1259* (2013.01); *H01L 27/3248* (2013.01); *H01L 27/3288* (2013.01); *H01L 29/24* (2013.01); *H01L 29/42356* (2013.01); *H01L 29/66969* (2013.01)

(56) References Cited

U.S. PATENT DOCUMENTS

| | | | |
|---|---|---|---|
| 2006/0289867 A1 | 12/2006 | Lim | |
| 2009/0108259 A1* | 4/2009 | Lin | G02F 1/134363 257/59 |
| 2010/0193827 A1* | 8/2010 | Lin | H01L 27/12 257/99 |
| 2011/0193076 A1 | 8/2011 | Yun et al. | |
| 2011/0273640 A1* | 11/2011 | Zhang | G02F 1/1309 349/43 |
| 2012/0119206 A1 | 5/2012 | Wang et al. | |
| 2012/0138921 A1 | 6/2012 | Endo et al. | |
| 2012/0229747 A1* | 9/2012 | Miyairi | G02F 1/133345 349/138 |
| 2014/0054579 A1* | 2/2014 | Kim | H01L 29/786 257/43 |
| 2014/0145178 A1* | 5/2014 | Lee | H01L 29/66969 257/43 |

FOREIGN PATENT DOCUMENTS

| | | |
|---|---|---|
| JP | 0786608 A | 3/1995 |
| JP | 07193252 A | 7/1995 |
| JP | 2005-136254 A | 5/2005 |
| JP | 2007-011351 A | 1/2007 |
| JP | 2012-178545 A | 9/2012 |
| KR | 20010054740 A | 7/2001 |
| KR | 20030011183 A | 2/2003 |
| KR | 20110093113 A | 8/2011 |
| KR | 20120051942 A | 5/2012 |
| KR | 20120129746 A | 11/2012 |

OTHER PUBLICATIONS

Korean Office Action Appln. No. 10-2014-7016237; Dated Jul. 28, 2015.
International Preliminary Report on Patentability Appln. No. PCT/CN2013/074651; Dated Aug. 4, 2015.
Chinese Patent Certificate dated Mar. 23, 2016; Appln. No. 2013 1 0044103.3.
Korean Examination Opinion dated Feb. 24, 2016; Appln. No. 10-2014-7016237.
Korean Examination Opinion dated Apr. 26, 2016; Appln. No. 10-2014-7016237.
Korean Office Action dated Jul. 18, 2016; Appln. No. 10-2014-7016237.
Extended European Search Report dated Sep. 2, 2016; Appln. No. 13848102.3-1904/2953165 PCT/CN2013074651.

* cited by examiner

OXIDE THIN FILM TRANSISTOR ARRAY SUBSTRATE HAVING TRANSPARENT CONNECTION STRUCTURE CONNECTING SOURCE ELECTRODE AND DATA LINE OF OXIDE TFT AND DISPLAY PANEL INCLUDING THE SAME

FIELD OF THE INVENTION

The disclosure relates to an oxide thin film transistor array substrate, a manufacturing method thereof, and a display panel.

BACKGROUND

As an active layer, an oxide active layer, such as indium gallium zinc oxide (IGZO), has carrier mobility, which is 20 to 30 times larger than that of amorphous silicon. This oxide active layer may greatly increase the charge/discharge rate of the TFT to the pixel electrode, improve the response speed of the pixel, and thus achieve more quickly refreshment rate, and therefore is a suitable material for the channel layer in the new generation thin film transistor liquid crystal display (TFT-LCD).

Generally, in an oxide TFT device, source/drain electrodes are contacted with the oxide active layer directly. At both sides of the oxide active layer, there is no PN junction between the oxide active layer and the source/drain electrodes. Thus, holes in the oxide active layer will flow into the source/drain electrodes, or the electrons in the source/drain electrodes will flow into the oxide active layer, which will increase the leakage current between the oxide active layer and the source/drain electrodes, and leads to the phenomenon such as picture blinking, crosstalk, or residual image of the display panel.

SUMMARY

The embodiment of this disclosure provides an oxide thin film transistor array substrate, the array substrate includes a base substrate, and an oxide TFT, a gate lines, a data line and a pixel electrode provided on the base substrate, wherein a drain electrode of the oxide TFT are connected with the pixel electrode, and a connection structure is provided between a source electrode of the oxide TFT and the data line, and the source electrode of the oxide TFT and the data line are electrically connected by the connection structure, a resistivity of the connection structure is larger than that of the source electrode.

In an example, the connection structure is formed by a transparent conductive material the same as the pixel electrode.

In an example, the oxide TFT includes a gate insulation layer provided on the gate line, an oxide active layer provided on the gate insulation layer and above the gate line, a etch barrier layer provided on the oxide active layer, and the source electrode and the drain electrode provided on the etch barrier layer and contacting with the oxide active layer, respectively, wherein at least one portion of the gate line below the oxide active layer is used as the gate electrode of the oxide TFT.

In an example, the oxide TFT array substrate includes a passive layer provided on the base substrate on which the pixel electrode is formed, and a common electrode provided on the passive layer and located in a pixel area.

In an example, the oxide active layer is indium gallium zinc oxide.

In an example, the etch barrier layer is provided with through holes exposing the oxide active layer above the active layer, and the source electrode and the drain electrode are contacted with the oxide active layer via the through holes.

Another embodiment of the present disclosure provides a display panel including the oxide TFT array substrate as disclosed in any of the embodiments of the present invention.

Still another embodiment of the present disclosure provides a manufacturing method for the oxide TFT array substrate, the method includes: forming a data line and a source electrode of the oxide TFT so that the data line and the source electrode are spaced from each other and providing a connection structure between the source electrode and the data line, wherein the source electrode and the data line are electrically connected with each other through the connection structure, and a resistivity of the connection structure is larger than that of the source electrode.

In an example, the connection structure is formed by a transparent conductive material the same as the pixel electrode.

In an example, the method includes: forming a pattern including a gate line on a base substrate by a first patterning process; forming a pattern including a gate insulation layer and an oxide active layer on the base substrate which has been subjected from the first patterning process by a second patterning process, the pattern for the oxide active layer being above the gate line; forming a pattern including a etch barrier layer on the base substrate which has been subjected from the second patterning process by a third patterning process; forming a pattern including a data line, a source electrode and a drain electrode on the base substrate which has been subjected from the third patterning process by a fourth patterning process, wherein the data line and the source electrode are formed to be spaced from each other; and forming a pattern including a pixel electrode and the connection structure at a location where the source electrode is spaced from the data line on the base substrate which has been subjected from the fourth patterning process by a fifth patterning process.

In an example, after the fifth patterning process, the method further includes forming a pattern including a passive layer on the base substrate which has been subjected from the fifth patterning process by a sixth patterning process; and forming a pattern including a common electrode on the base substrate which has been subjected from the sixth patterning process by a seventh patterning process.

In an example, the oxide active layer is indium gallium zinc oxide.

An embodiment of the present invention provides an oxide TFT array substrate, a manufacturing method thereof, and a display panel. Since the connection structure 21 is provided between the source electrode 15 and the data line 17, and the resistivity of the connection structure is larger than the resistivity of the source electrode 15, the resistance between the source electrode 15 and the data line 17 is increased, and thus the leakage current of the oxide TFT is reduced, the phenomenon such as picture blinking, crosstalk, or residual image of the display panel can be suppressed and thus the display performance is improved.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

It is to be noted the directional term "up" or "down" in the following description is only used to describe the embodiments of the present disclosure with reference to the attached drawings, but should not be construed as limitation.

Embodiment 1

Figure 1:
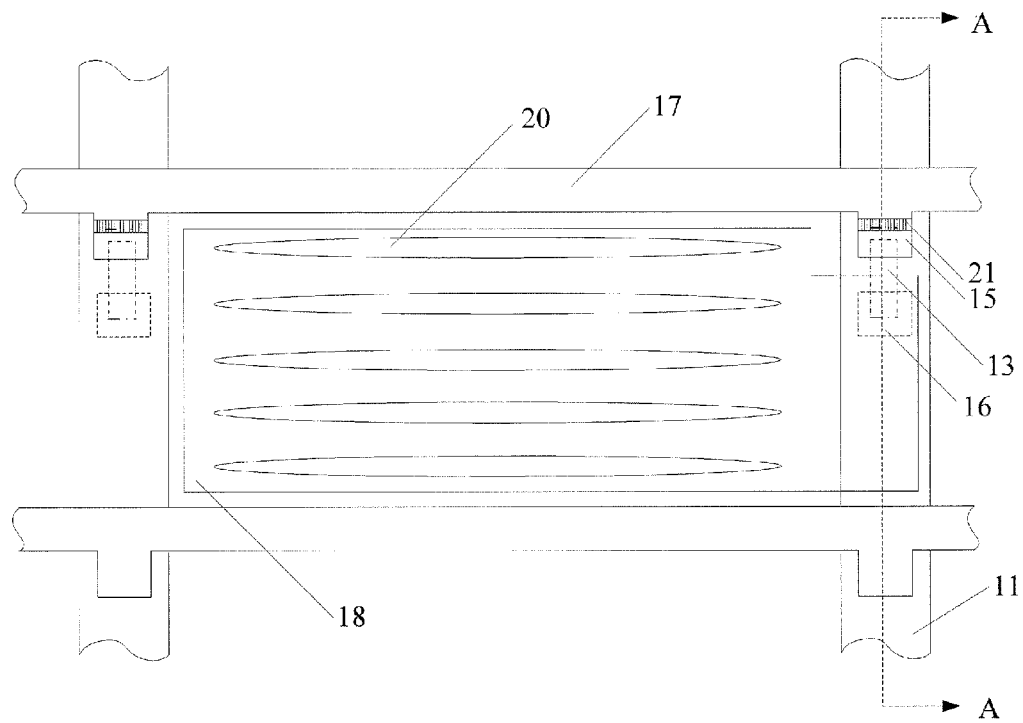
FIG. 1 is a top structural schematic view of an oxide TFT array substrate according to an embodiment of the present disclosure.
Figure 2:
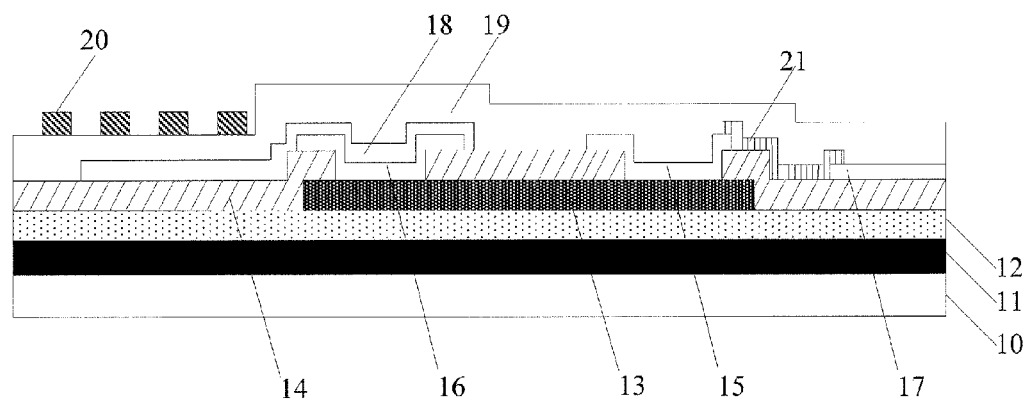
FIG. 2 is a cross sectional view of the oxide TFT array substrate taken along A-A on a gate line, according to the embodiment of the present disclosure.

The embodiment of the present disclosure provides an oxide TFT array substrate. As illustrated in FIG. 1 and FIG. 2, the array substrate includes a base substrate 10, and an oxide thin film transistor (TFT), a gate line 11, a data line 17 and a pixel electrode 18 provided on the base substrate 10. The oxide TFT includes a gate insulation layer 12 located on the gate line 11, an oxide active layer 13 located on the gate insulation layer 12, a source electrode 15 and a drain electrode 16 located on the oxide active layer 13. A gap is provided between the source electrode 15 and the drain electrode 16, and the portion of the oxide active layer 13 below the gap is formed into a channel area. At least one portion of the gate line 11 below the channel area is used as a gate electrode of the oxide TFT.

As illustrated in FIG. 1, the gate line 11 is located below the oxide active layer 13, the source electrode 15 and the drain electrode 16 so that the gate line 11 shields the oxide active layer in the channel between the source electrode 15 and the drain electrode 16, and thus the probability at which the electron-hole pair is generated upon illumination is effectively lowered, and the leakage current incurred by illumination is greatly reduced.

As illustrated in FIG. 1, the gate line 11 and the data line 17 intersect with each other to define a pixel area. The pixel electrode 18 is formed in the pixel area and is extended to the drain electrode 16 of the oxide TFT and electrically connected with the drain electrode 16.

A connection structure 21 is provided between the source electrode 15 and the data line 17. The connection structure 21 is connected with the source electrode 15 and the data line 17, respectively, by which the source electrode 15 and the data line 17 are electrically connected with each other. The resistivity of the connection structure 21 is larger than the resistivity of the source electrode 15. For example, the source electrode 15 is composed of metal, and the connection structure 21 is constructed by a transparent conductive material. That is to say, in the present embodiment, the source electrode 15 and the data line 17 are not connected directly, but are electrically connected through the connection structure 21.

Since the connection structure 21 is provided between the source electrode 15 and the data line 17, the resistivity of the connection structure is larger than the resistivity of the source electrode 15, the resistance between the source electrode 15 and the data line 17 can be effectively increased, and thus the leakage current between the source electrode 15 and the data line 17 is reduced and the display quality and stability of the TFT can be improved.

In the present embodiment, there is no limitation on the arrangement of the oxide TFT, the gate line, the data line and the pixel electrode, any arrangement can be employed according to the practical necessary. Besides the above components, the array substrate of the present embodiment may further include other components.

By way of example, the structure of the TFT array substrate will be described with a single sub-pixel of an oxide TFT array substrate of advanced dimension switch (ADS, in short) type as an example, with reference to FIG. 1 and FIG. 2.

The gate line 11 is provided on the base substrate 10, the gate insulation layer 12 is provided on the gate line 11, and the oxide active layer 13 is provided on the gate insulation layer 12 above the gate line 11.

Figure 4:
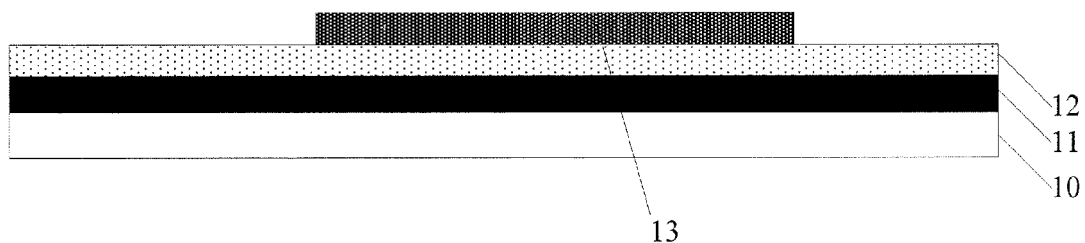
FIG. 4 is a structural schematic view after a second patterning process of the manufacturing method of the oxide TFT array substrate according to the embodiment of the present disclosure.

In addition, the oxide TFT array substrate may further include the source electrode 15 and the drain electrode 16 which are located on the oxide active layer 13. The gate line 11, the gate insulation layer 12, the oxide active layer 13, and the source electrode 15, the drain electrode 16 construct the oxide TFT. At least one portion of the gate line 11 located below the oxide active layer 13 is used as the gate electrode of the oxide TFT. In one example, the oxide TFT further includes an etch barrier layer 14 provided on the oxide active layer 13, the etch barrier layer 14 is used to protect the oxide active layer in a channel formed between the source electrode 15 and the drain electrode 16 from being etched, during the formation of the source electrode 15 and the drain electrode 16. The etch barrier layer 14 at least covers the channel area between the source electrode 15 and the source electrode 16. FIG. 4 illustrates that the area of the gate line 11 other than the area where the source electrode 15, the drain electrode 16 and the oxide active layer 13 are contacted is covered by the etch barrier layer 14. The source electrode 15 and the drain electrode 16 are contacted with the oxide active layer 13 via through holes formed in the etch barrier layer 14 above the oxide active layer. During the practical formation, the pattern of the etch barrier layer 14 can be determined according to the practical used process and the requirement, there is no limitation. For example, the source electrode 15 and the drain electrode 16 are contacted with the oxide active layer 13, respectively, and the gap formed between the source electrode 15 and the drain electrode 16 is located on the etch barrier layer 14.

The oxide TFT array substrate further includes the data line 17 located at the same layer as the source electrode 15 and the drain electrode 16, and the connection structure 21 provided between the source electrode 15 and the data line 17. The connection structure 21 is connected with the source electrode 15 and the data line 17, respectively, and the source electrode 15 and the data line 17 are connected through the connection structure 21.

The oxide TFT array substrate further includes a pixel electrode 18 provided in the pixel area. Specifically, the gate line 11 and the data line 17 are intersected with each other to define the pixel area in which the pixel electrode 18 is located. The pixel electrode 18 is extended to the drain electrode 16 and connected with the drain electrode 16.

In addition, the oxide TFT array substrate further includes a passive layer 19 provided on the base substrate 10 on which the pixel electrode 18 is formed; and a common electrode 20 provided on the passive layer 19 in the pixel area.

The oxide TFT as illustrated in FIG. 1 and FIG. 2 is provided on the gate line 11, since the gate line is formed by opaque metal, it can shield the channel of the oxide TFT at the same time, and thus can reduce the leakage current of the oxide TFT array substrate due to illumination.

It is to be noted that the above FIG. 1 and FIG. 2 are merely described with the bottom gate structure of the ADS type oxide TFT array substrate as an example, but will not limit the present disclosure to such a bottom gate structure of the TFT array substrate. The present disclosure can be equally applied to the top gate structure of the TFT array substrate in which the source electrode 15, the drain electrode 16 and the oxide active layer 13 are directly contacted, the present disclosure will not be specially limited herein.

It is to be noted that above FIG. 1 and FIG. 2 are merely described with the bottom gate structure of the ADS type oxide TFT array substrate as an example, but it will not limit the present disclosure as only applying to the ADS type of oxide TFT array substrate. The present disclosure can be equally applied to twisted nematic (TN) type oxide TFT array substrate in which the source electrode 15, the drain electrode 16 and the oxide active layer 13 are directly contacted, thus the present disclosure will not be specially limited.

Furthermore, in order to reduce the number of the patterning process during the manufacture of the oxide TFT array substrate, the connection structure 21 may be formed by the same transparent material as the pixel electrode 18, such as ITO (indium tin oxide), thus the connection structure 21 may be formed with the pixel electrode 18 in the patterning process for forming the pixel electrode 18.

For example, the oxide active layer 13 includes IGZO (indium gallium zinc oxide).

In the oxide TFT array substrate as provided by the present embodiment, since the connection structure 21 is provided between the source electrode 15 and the data line 17, the resistivity of the connection structure 21 is larger than the resistivity of the source electrode 15, the leakage current between the source electrode 15 and the data line 17 can be reduced, and thus the leakage current of the oxide TFT is reduce, the phenomenon such as picture blinking, crosstalk, and residue image of the display panel can be suppressed, and the display performance is improved.

Based on the above oxide TFT array substrate, the embodiment of the present disclosure further provides a manufacturing method for the oxide TFT array substrate, the method includes: forming the connection structure 21 between the source electrode 15 and the data line 17 by patterning process, wherein the source electrode 15 and the data line 17 are connected by the connection structure 21, and the resistivity of the connection structure 21 is larger than the resistivity of the source electrode 15.

Hereinafter, by way of example, the manufacturing method for the ADS type oxide TFT array substrate according to the embodiment of the present disclosure will be described in detail. It is to be noted that the patterning process as described below includes exposure, development, etching, aching, and so on. The method includes the follows steps:

501, forming a pattern including the gate line 11 on the base substrate 10 by a first patterning process.

For example, during the first patterning process, a gate metal layer film is firstly applied on the base substrate 10, and then photoresist is formed on the base substrate 10 coated with the gate metal layer film.

By using a mask plate, the photoresist is exposed and developed, to form a photoresist fully retained area and a photoresist fully removed area; wherein the photoresist fully retained area corresponds to the area of the gate line 11, and the photoresist fully removed area corresponds to the area in the pixel unit other than the photoresist fully retained area.

Figure 3:
FIG. 3 is a structural schematic view after a first patterning process of an manufacturing method of an oxide TFT array substrate according to an embodiment of the present disclosure.

The gate metal layer film on the photoresist fully removed area is removed by etching process and then the photoresist on the photoresist fully retained area is peeled off by ashing process, as illustrated in FIG. 3, to expose the pattern for the gate line 11 to form the gate line 11.

502, forming a pattern including the gate insulation layer 12 and the oxide active layer 13 on the base substrate which has been subjected from the first patterning process by a second patterning process.

The pattern for the oxide active layer 13 is above the gate line 11, since the gate line metal is opaque metal, whereby the channel of the oxide TFT could be shielded, and thus the leakage current of the oxide TFT array substrate due to illumination can be reduced.

For example, during the second patterning process, a gate insulation layer film and an oxide active layer film are firstly applied on the base substrate 10 which has been subjected from the first patterning process. Then, photoresist is formed on the base substrate 10 coated with the gate insulation layer film and the oxide active layer film.

By using a mask plate, the photoresist is exposed, developed to form a photoresist fully retained area and a photoresist fully removed area, wherein the photoresist fully retained area corresponds to the area for the oxide active layer 13, and the photoresist fully removed area corresponding to the area in the pixel unit other than the photoresist fully retained area.

The oxide active layer film on the photoresist fully removed area is removed by etching process and then the photoresist on the photoresist fully retained area is peeled off by ashing process, as illustrated in FIG. 4, to expose the pattern for the oxide active layer 13 to form the gate insulation layer 12 and the oxide active layer 13.

503, forming a pattern including an etch barrier layer 14 on the base substrate which has been subjected from the second patterning process by a third patterning process.

During the third patterning process, an etch barrier layer film is firstly applied on the base substrate 10 which has been subjected from the second patterning process, and then, photoresist is formed on the base substrate coated with the etch barrier layer film.

By using a mask plate, the photoresist is exposed and developed, to form a photoresist fully retained area and a photoresist fully removed area, in which the photoresist fully retained area corresponds to the area for the etch barrier layer 14, and the photoresist fully removed area corresponds to the area in the pixel unit other than the photoresist fully retained area.

Figure 5:
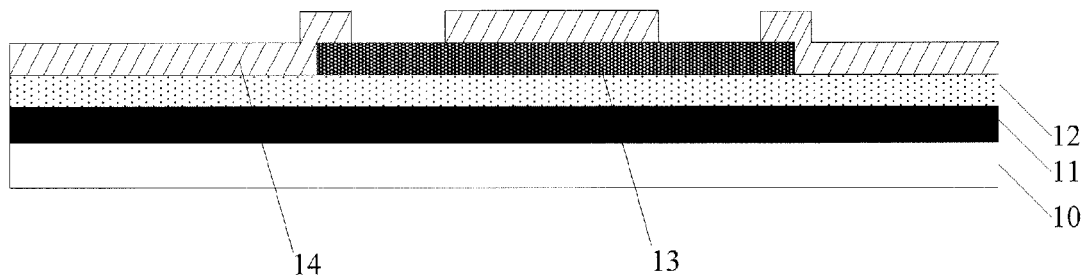
FIG. 5 is a structural schematic view after a third patterning process of the manufacturing method of the oxide TFT array substrate according to the embodiment of the present disclosure.

The etch barrier layer film on the photoresist fully removed area is removed by etching process, and then the photoresist in the photoresist fully retained area is peeled off by ashing process, as illustrated in FIG. 5, to expose the pattern for the etch barrier layer 14 to form the etch barrier layer 14.

504, forming a pattern including the data line 17, the source electrode 15, the drain electrode 16, and pattern 22 partitioning source electrode 15 and data line 17 on the base substrate 10 which has been subjected from the third patterning process by the fourth patterning process.

During the fourth patterning process, firstly, a source/drain metal layer film is applied on the base substrate 10 which has been subjected from the third patterning process, then, a photoresist in formed on the base substrate 10 coated with the source/drain metal layer film.

By using a mask plate, the photoresist is exposed and developed to form a photoresist fully retained area and a photoresist fully removed area in which the photoresist fully retained area corresponds to the area for the source electrode 15, the drain electrode 16 and the data line 17, and the photoresist fully removed area corresponds to the area in the pixel unit other than the photoresist fully retained area, in which the pattern 22 partitioning source electrode 15 and the data line 17 is included.

Figure 6:
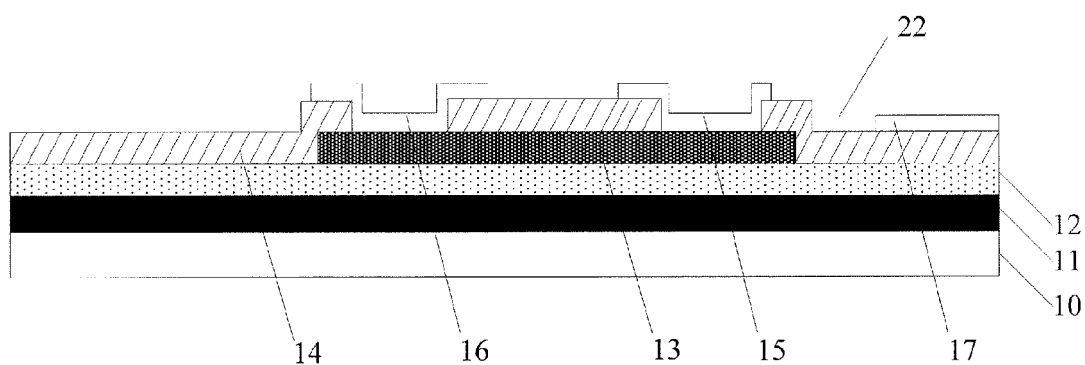
FIG. 6 is a structural schematic view after a fourth patterning process of the manufacturing method of the oxide TFT array substrate according to the embodiment of the present disclosure.

The source/drain metal layer film on the photoresist fully removed area is removed by etching process, and then the photoresist on the photoresist fully retained area is peeled off by ashing process, as illustrated in FIG. 6, to form the pattern for the source electrode 15, the drain electrode 16, the data line 17, and the pattern 22 partitioning the source electrode 15 and the data line 17.

505, forming a pattern including the pixel electrode 18 and connection structure 21 on the pattern 22 partitioning the source electrode 15 and the data line 17 on the base substrate 10 which has been subjected from the fourth patterning process by the fifth patterning process.

The connection structure 21 includes the same transparent conductive material as the pixel electrode 18.

During the fifth patterning process, firstly, a transparent conductive layer film is applied on the base substrate which has been subjected from the fourth patterning process, then, photoresist is formed on the base substrate coated with the transparent conductive film.

By using a mask plate, the photoresist is exposed and developed to form a photoresist fully retained area and a photoresist fully removed area in which the photoresist fully retained area corresponds to the area of the pixel electrode 18 and the area of the connection structure 21, and the photoresist fully removed area corresponds to the area in the pixel unit other than the photoresist fully retained area.

Figure 7:
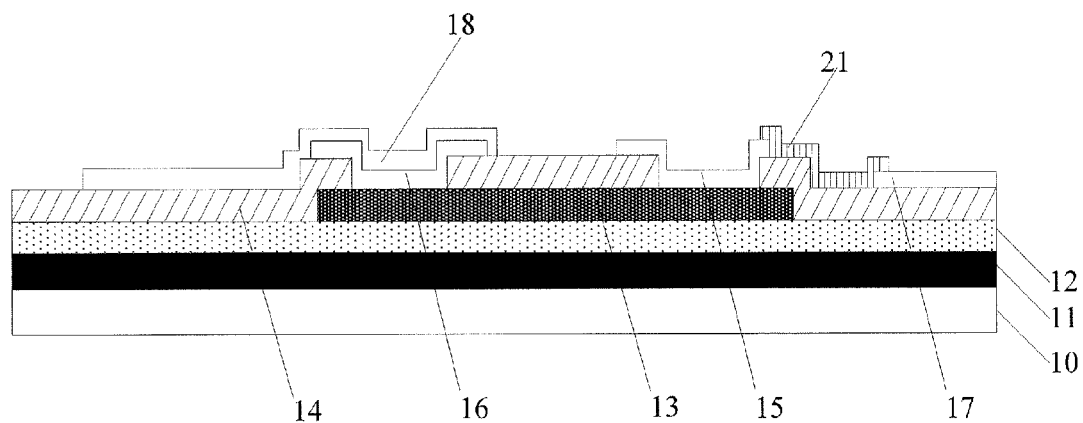
FIG. 7 is a structural schematic view after a fifth patterning process of the manufacturing method of the oxide TFT array substrate according to the embodiment of the present disclosure.

The transparent conductive layer film on the photoresist fully removed area is removed by etching process, and then, the photoresist on the photoresist fully retained area is peeled off by ashing process, as illustrated in FIG. 7, to expose the pixel electrode 18 and the connection structure 21.

506, forming a pattern for a passive layer 19 formed on the base substrate which has been subjected from the fifth patterning process by the sixth patterning process.

During the sixth patterning process, firstly, a passive layer film is applied on the base substrate 10 which has been subjected from the fifth patterning process, then, a photoresist is formed on the base substrate 10 coated with the passive layer film.

By using a mask plate, the photoresist is exposed and developed, to form a photoresist fully retained area and a photoresist fully removed area in which the photoresist fully retained area corresponds to the area for the passive layer 19 and the photoresist fully removed area corresponds to the area in the pixel cell other than the photoresist fully retained area, and specifically, the photoresist fully removed area includes a lead via for the gate line and a lead via for the data line (not illustrated in figs).

507, forming a pattern for the common electrode 20 on the base substrate which has been subjected from the sixth patterning process by the seventh patterning process.

During the seventh patterning process, firstly, a transparent conductive layer film is applied on the base substrate 10 which has been subjected from the sixth patterning process, and then photoresist is formed on the base substrate 10 coated with the transparent conductive layer film.

By using a mask plate, the photoresist is exposed and developed, to form a photoresist fully retained area and a photoresist fully removed area in which the photoresist fully retained area corresponds to the area for the common electrode 20 and the photoresist fully removed area corresponds to the area in the pixel unit other than the photoresist fully retained area.

The transparent conductive layer film in the photoresist fully removed area is removed by etching process, and then the photoresist on the photoresist fully retained area is peeled off by ashing process, as illustrated in FIG. 2, to form the common electrode 20.

It is to be noted that in the manufacturing method for the oxide TFT array substrate according to the embodiment of the present disclosure, in order to reduce the number of the patterning process, the connection structure 21 uses the same transparent conductive material as the pixel electrode 18, so that the connection structure 21 and the pixel electrode 18 are formed in a single patterning process. But the present disclosure is not limited to the situation that the connection structure 21 can only use the same transparent conductive material as the pixel electrode 18, and in fact, the connection structure 21 may use any other material, as long as the resistivity of this material is larger than the resistivity of the source electrode 15, however, in this situation, the connection structure 21 and the pixel electrode 18 should be formed in two patterning processes.

Furthermore, it is to be noted that although the above described manufacturing method for the oxide TFT array substrate according to the embodiment of the present disclosure includes seven patterning process, the present disclosure would not be limited thereto, and other number of the patterning process which can form the connection structure 21 between the source electrode 15 and the data line 17 will also fall within the scope of the present disclosure.

With the manufacturing method for the oxide TFT array substrate according to the embodiment of the present disclosure, since the connection structure 21 is formed between the source electrode 15 and the data line 17 and the resistivity of the connection structure 21 is larger than the resistivity of the source electrode 15, the leakage current between the source electrode 15 and the data line 17 is reduced, and thus the leakage current of the oxide TFT is reduced, the phenomenon such as picture blinking, crosstalk, and residue image of the display panel can be suppressed, and the display performance is improved.

The embodiment of the present disclosure provides a display panel including the oxide TFT array substrate as provided in the above embodiments.

Specifically, the display panel could be a liquid crystal display panel, and could also be an OLED (organic light-emitting diode) display panel, and the like.

Figure 8:
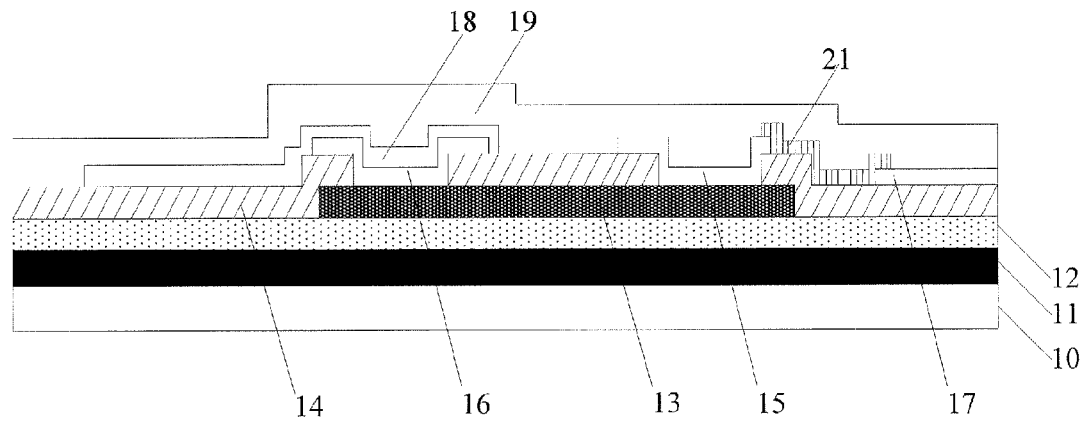
FIG. 8 is a structural schematic view after a sixth patterning process of the manufacturing method of the oxide TFT array substrate according to the embodiment of the present disclosure.
Figure 9:
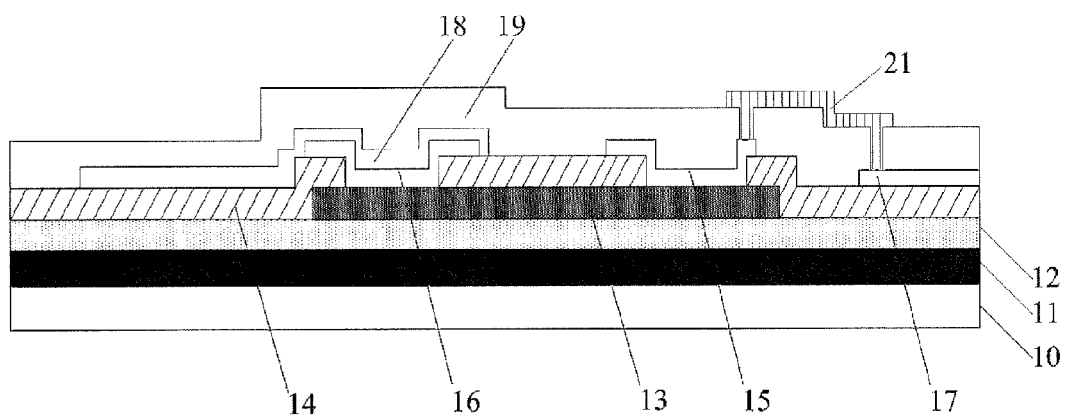
FIG. 9 is a top structural schematic view of an oxide TFT array substrate according to another embodiment of the present disclosure.

Some embodiments of the present invention have been described above, but the technical solution of the present invention should not be limited to the above specific structure and method. For example, in the above embodiment, the connection structure 21 is provided at the same layer with the pixel electrode 18. But the position of the connection structure 21 is not limited thereto. As illustrated in FIG. 9, the connection structure 21 may be formed on the passive layer 19, and respectively connected to the source electrode 15 and the data line 17 by the through holes in the passive layer 19 above the source electrode 15 and the data line 17. During manufacturing the array substrate in FIG. 9, the steps before forming the connection structure 21 (the steps from the above first patterning process to the above fourth patterning process) may be the same as that in manufacturing the array substrate in FIG. 8, but in the process forming the pixel electrode 18 (the above fifth patterning process), the connection structure 21 would not be formed. After forming the passive layer 19, through holes are formed in the passive layer 19 above the source electrode 15 and the data line 17, respectively (can be formed in the above sixth patterning process), and then the connection structure 21 is formed on these through holes to connect to the source electrode 15 and the data line 17 by the through holes (may be formed together with the common electrode in the seventh patterning process).

What are described above is related to the illustrative embodiments of the disclosure only and not limitative to the scope of the disclosure; the scopes of the disclosure are defined by the accompanying claims.

What is claimed is:

1. An oxide thin film transistor (TFT) array substrate including a base substrate and an oxide TFT, a gate line, a data line and a pixel electrode provided on the base substrate, a drain electrode of the oxide TFT being connected with the pixel electrode, wherein
a connection structure is provided between a source electrode of the oxide TFT and the data line, the source electrode of the oxide TFT and the data line are electrically connected through the connection structure, and a resistivity of the connection structure is larger than that of the source electrode,
the source electrode and the data line are disposed in a same layer,
a passive layer is provided on the source electrode, the connection structure and the data line, both the source electrode and the data line interface the passive layer and are disposed on a same side of the passive layer,
wherein the oxide TFT includes:
a gate insulation layer provided on the gate line;
an oxide active layer provided on the gate insulation layer and above the gate line;
an etch barrier layer provided on the oxide active layer; and
the source electrode and the drain electrode provided on the etch barrier layer and contacting with the oxide active layer, respectively,
wherein at least one portion of the gate line below the oxide active layer is used as a gate electrode of the oxide TFT,
wherein the etch barrier layer is provided with through holes exposing the oxide active layer, and the source electrode and the drain electrode are contacted with the oxide active layer via the through holes.

2. The oxide TFT array substrate according to claim 1, wherein the connection structure is formed by a transparent conductive material the same as the pixel electrode.

3. The oxide TFT array substrate according to claim 2, further including:
a common electrode provided on the passive layer and located in a pixel area.

4. The oxide TFT array substrate according to claim 1, further including:
a common electrode provided on the passive layer and located in a pixel area.

5. The oxide TFT array substrate according to claim 1, wherein, the oxide active layer is indium gallium zinc oxide.

6. A display panel including the oxide TFT array substrate, the oxide TFT array substrate including a base substrate and an oxide TFT, a gate line, a data line and a pixel electrode provided on the base substrate, a drain electrode of the oxide TFT being connected with the pixel electrode, wherein
a connection structure is provided between a source electrode of the oxide TFT and the data line, the source electrode of the oxide TFT and the data line are electrically connected through the connection structure, and a resistivity of the connection structure is larger than that of the source electrode,
the source electrode and the data line are disposed in a same layer,
a passive layer is provided on the source electrode, the connection structure and the data line, both the source electrode and the data line interface the passive layer and are disposed on a same side of the passive layer,
wherein the oxide TFT includes:
a gate insulation layer provided on the gate line;
an oxide active layer provided on the gate insulation layer and above the gate line;
an etch barrier layer provided on the oxide active layer; and
the source electrode and the drain electrode provided on the etch barrier layer and contacting with the oxide active layer, respectively,
wherein at least one portion of the gate line below the oxide active layer is used as a gate electrode of the oxide TFT,
wherein the etch barrier layer is provided with through holes exposing the oxide active layer, and the source electrode and the drain electrode are contacted with the oxide active layer via the through holes.

7. A manufacturing method of the oxide thin film transistor (TFT) array substrate according to claim 1, the method including:

forming a pattern including a gate line on a base substrate by a first patterning process;

forming a pattern including a gate insulation layer and an oxide active layer on the base substrate which has been subjected from the first patterning process by a second patterning process, the pattern for the oxide active layer being above the gate line;

forming a pattern including an etch barrier layer on the base substrate which has been subjected from the second patterning process by a third patterning process;

forming a data line and a source electrode of the oxide TFT so that the data line and the source electrode are spaced from each other and providing a connection structure between the source electrode and the data line, forming a pattern including a pixel electrode and a connection structure, the pixel electrode being connected with a drain electrode of the oxide TFT; and forming a passive layer on the source electrode, the connection structure and the data line, both the source electrode and the data line interfacing the passive layer and being disposed on a same side of the passive layer, wherein the source electrode and the data line are electrically connected with each other through the connection structure, and a resistivity of the connection structure is larger than that of the source electrode, wherein the etch barrier layer is provided with through holes exposing the oxide active layer, and the source electrode and the drain electrode are contacted with the oxide active layer via the through holes.

8. The method according to claim 7, wherein the connection structure is formed by a transparent conductive material the same as the pixel electrode.

9. The method according to claim 7, wherein after forming the passive layer, the method further includes:

forming a pattern including a common electrode on the passive layer.

10. The method according to claim 7, wherein the oxide active layer is indium gallium zinc oxide.

* * * * *